United States Patent [19]
Saito et al.

[11] Patent Number: 6,121,634
[45] Date of Patent: Sep. 19, 2000

[54] NITRIDE SEMICONDUCTOR LIGHT EMITTING DEVICE AND ITS MANUFACTURING METHOD

[75] Inventors: Shinji Saito; Genichi Hatakoshi, both of Yokohama; Masaaki Onomura; Hidetoshi Fujimoto, both of Kawasaki; Norio Iizuka, Hackhoji; Chiharu Nozaki, Yokohama; Johji Nishio, Kawasaki; Masayuki Ishikawa, Yokohama, all of Japan

[73] Assignee: Kabushiki Kaisha Toshiba, Kawasaki, Japan

[21] Appl. No.: 09/027,490

[22] Filed: Feb. 20, 1998

[30] Foreign Application Priority Data

Feb. 21, 1997 [JP] Japan ................................ 9-037798

[51] Int. Cl.[7] ............................ H01L 27/15; H01L 31/12; H01L 33/00
[52] U.S. Cl. ................................ 257/86; 257/94; 257/101
[58] Field of Search ................................ 257/79, 86, 94, 257/101

[56] References Cited

U.S. PATENT DOCUMENTS 5,557,115  9/1996  Shakuda ................................ 257/81
5,852,625  12/1998  Takahashi ................................ 372/96
5,913,986  6/1999  Matsuyama ................................ 136/255

FOREIGN PATENT DOCUMENTS 2519879  5/1996  Japan .

OTHER PUBLICATIONS

T. Takayama, et al., Appl. Phys. Lett., vol. 69, No. 24, pp. 3656–3658, Dec. 9, 1996, "Small–Astigmatism, Low–Noise, and High–Power Self–Sustained Pulsation Multiple–Quantum–Well Laser Diodes with a Real Refractive Index Guided Self–Aligned Structure".

*Primary Examiner*—Brian Dutton
*Attorney, Agent, or Firm*—Oblon, Spivak, McClelland, Maier & Neustadt, P.C.

[57] ABSTRACT

In a nitride compound semiconductor light emitting device, an $In_{0.3}Ga_{0.7}N/GaN$ multi-quantum well active layer 105 or an $In_{0.1}Ga_{0.9}N/GaN$ multi-quantum well adjacent layer 104 is made as a saturable absorptive region so that self-pulsation occurs there. Thus, the device ensures self-pulsation with a high probability with a simple structure, and satisfies requirements for use as an optical head for reading data from an optical disc.

17 Claims, 12 Drawing Sheets

NITRIDE SEMICONDUCTOR LIGHT EMITTING DEVICE AND ITS MANUFACTURING METHOD

BACKGROUND OF THE INVENTION

1. Field of the Invention

This invention relates to a light emitting device using GaN, AlGaN, InGaN or other nitride compound semiconductors, and its manufacturing method.

2. Description of the Related Art

Nitride semiconductor light emitting devices can emit light of short wavelengths of 350 nm or less, oscillation of semiconductor lasers in 400 nm has actually been confirmed. As for their reliability, it has been reported that LEDs have a life as long as ten thousands hours or more. Therefore, nitride semiconductor light emitting devices are hopefully expected to be useful as light sources of optical disc recording systems of next-generation.

For epitaxial growth of nitride compound semiconductors, hexagonal crystals obtained by growth on a sapphire, SiC or spinel substrate are currently considered best. Since sapphire and spine substrates are electrically insulative, both a p-side electrode and an n-side electrode must be formed along the top surface of a nitride compound semiconductor. However, in case of a light emitting device, such as semiconductor laser, which requires injection of a high current density, there occurs a leak current which flows along the surface of the semiconductor. This causes a decrease in amount of current contributing to emission of light, a decrease in light emission efficiency, and a decrease in reliability of the semiconductor laser. By using a current-confining structure, it is possible to suppress such a leak current and increase the current density sufficiently for a semiconductor laser to operate with a low driving current. However, it has been difficult to make a current-confining structure in nitride semiconductor light emitting devices. Therefore, no reliable semiconductor laser, operative with a low operation voltage with no leak current even upon injection of a high current, has been obtained.

Another problem with conventional nitride semiconductor lasers is the noise caused by changes in optical strength during oscillation when a laser used as a data-reading light source in an optical disc recording system. A possible countermeasure is to use a self-pulsation structure, for example. However, it is difficult to invite self-pulsation in conventional nitride semiconductor lasers because the active layer is a thin film. Other possible measures for treating the problem, such as high frequency multiplexing or use of two kinds of lasers, invite structural complexity. There is also a report on incorporating two kinds of laser structures in a single device by locally changing the thickness of the active layer. This approach, however, has revealed the difficulty in controlling the thickness of the active layer. Moreover, although a pickup head for reading and writing is typically composed of two kinds of lasers different in output power, its structure is much complicated.

As discussed, it has been difficult to fabricate inexpensive semiconductor lasers usable as reading and/or writing optical heads for optical disc systems.

SUMMARY OF THE INVENTION

It is therefore an object of the invention to provide a nitride semiconductor light emitting device having a simple structure and inducing self-pulsation, and a method for manufacturing same.

According to the invention, there is provided a nitride compound semiconductor light emitting device comprising: a substrate; an active layer formed on the substrate and made of a nitride compound semiconductor having a hexagonal crystalline structure; and an adjacent layer formed in contact with the active layer at least either on or under the active layer, and including a nitride compound semiconductor layer having a hexagonal crystalline structure and doped with an impurity, in which the nitride compound semiconductor layer in the adjacent layer includes island regions in a scattered in-plane distribution within the layer, which contain selected one of elements forming the nitride compound semiconductor by a higher concentration than the surrounding region, and the island regions contain the impurity by a lower concentration than the surrounding region.

Each island region may have a portion where the concentration of the selected one of elements forming the nitride compound semiconductor changes by at least 10% per 2 nm in a direction normal to the C axis of the hexagonal crystal.

The mean diameter of the island regions is preferably not larger than 100 nm.

The active layer may include pit regions in a scattered in-plane distribution within the layer, the pit regions are filled with the nitride compound semiconductor forming the adjacent layer.

Pit regions may be formed in the adjacent layer in a scattered in-plane distribution within the layer.

The adjacent layer may have multi-quantum wells, and the selected one of elements forming the nitride compound semiconductor may be one of indium, aluminum and gallium.

The impurity may be at least one selected from the group consisting of Si, C, Ge, Sn and Pb.

The active layer may have multi-quantum wells and may include island regions in a scattered in-plane distribution within the layer, which contain one of elements forming the nitride compound semiconductor by a higher concentration than the surrounding region, the island regions having a band gap equal to or smaller than the band gap of the material of the surrounding region by a difference within 10 meV.

The device preferably satisfies the relation of $\lambda m = 2nd$ (m=1, 2, 3, 4) where d is the distance between island regions, n is the refractive index of the surrounding region around the island regions, and $\lambda$ is the emission wavelength of the island regions.

The active layer may have pit regions in a scattered in-plane distribution within the layer, which are filled with the semiconductor forming said adjacent layer, and the adjacent layer may have pit regions in a scattered in-plane distribution within the layer, which are filled with a semiconductor forming a layer adjacent thereto other than the active layer.

The mean diameter of the island regions is preferably not larger than 100 nm.

According to another aspect of the invention, there is provided a nitride compound semiconductor light emitting device comprising: a substrate; an active layer formed on the substrate and made of a nitride compound semiconductor containing at least three different elements as matrix components thereof and having a hexagonal crystalline structure; and an adjacent layer formed in contact with the active layer at least either on or under the active layer, and including a nitride compound semiconductor layer having a hexagonal crystalline structure and doped with an impurity, in which the active layer includes pit regions in a scattered in-plane distribution within the layer, which are filled with the semiconductor forming the adjacent layer.

The adjacent layer may have formed pit regions in a scattered in-plane distribution within the layer.

The active layer has multi-quantum wells and includes island regions in a scattered in-plane distribution within the layer, which contain one of elements forming the nitride compound semiconductor by a higher concentration than the surrounding region, the island regions having a band gap equal to or smaller than the band gap of the material of the surrounding region by a difference within 10 meV.

The mean diameter of the island regions in the active layer is preferably not larger than 100 nm.

The active layer may have a multi-quantum well structure which includes at least an InGaN layer.

According to another aspect of the invention, there is provided a nitride compound semiconductor light emitting device comprising: a substrate; an active layer formed on the substrate and made of a nitride compound semiconductor having a hexagonal crystalline structure; and an adjacent layer formed in contact with the active layer at least either on or under the active layer, and including a nitride compound semiconductor layer having a hexagonal crystalline structure and doped with an impurity, in which the adjacent layer has pit regions in a scattered in-plane distribution within the layer.

According to a further aspect of the invention, there is provide a method for manufacturing a nitride compound semiconductor light emitting device having a substrate; an active layer formed on the substrate and made of a nitride compound semiconductor containing at three different elements as matrix components thereof and having a hexagonal crystalline structure; and an adjacent layer formed in contact with the active layer at least either on or under the active layer, and including multi-quantum wells containing well layers and barrier layers made of nitride compound semiconductors having a hexagonal crystalline structure and doped with an impurity, comprising the steps of:

forming said active layer on the substrate; and forming the multi-quantum wells by supplying a source material gas for growth of the well layers and a source material gas for growth of said barrier layers alternately for a predetermined time to grow said well layers and the barriers alternately, and by putting a predetermined waiting time between the growth of each well layer and the growth of each barrier layer.

The source material gas for growth of the well layers may contain trimethyl indium, trimethyl gallium and ammonium, and the source material gas for growth of the barrier layers may contain trimethyl gallium and ammonium.

According to a still further aspect of the invention, there is provided a method for manufacturing a nitride compound semiconductor light emitting device having a substrate; an active layer formed on the substrate and made of a nitride compound semiconductor containing at least three different elements as matrix components thereof and having a hexagonal crystalline structure; and an adjacent layer formed in contact with the active layer at least either on or under said active layer, and including multi-quantum wells containing well layers and barrier layers made of nitride compound semiconductors having a hexagonal crystalline structure and doped with an impurity, comprising the step of:

epitaxially growing the active layer by using at least trimethyl indium, trimethyl gallium and ammonium under the conditions where the growth temperature is in the range from 700° C. to 850° C., the total flow rate of material gases and carrier gases is in the range from 10 liters to 50 liters per minute in standard conversion, and the mol flow rate ratio of a material gas for group V elements and a material gas for group III elements is in the range from 1000 to 15000.

In summary, the most important feature of the present invention lies in that an active layer and an adjacent layer adjacent to the active layer in a nitride semiconductor light emitting device are saturable absorption regions to invite self-pulsation.

Therefore, the invention can realize a semiconductor laser inducing self-pulsation without the need for a complicated structure and having low-noise characteristics suitable for use as a reading semiconductor laser in an optical disc system. Additionally, the invention makes it possible to build a writing laser with the same structure as that of the reading laser and to thereby simplify the structure of a pickup head for both writing and reading.

That is, the invention promises a high productivity of nitride semiconductor light emitting devices promoting self-pulsation and having a simple construction. As a result, a semiconductor laser having low-noise characteristics and satisfying requirements for practical use as a semiconductor laser for reading data from an optical disc recording medium can be manufactured easily and economically, and its usefulness is immeasurably great. Additionally, the invention makes it easy to write and read data on or from recording medium by using nitride compound semiconductor lasers with the same structure, and remarkably simplifies the structure of the read-and-write common head. The invention also makes it possible to obtain a nitride light emitting diode with a high emission efficiency.

DETAILED DESCRIPTION OF THE PREFERRED EMBODIMENTS

Explained below are embodiments of the invention with reference to the drawings.

Figure 1A:
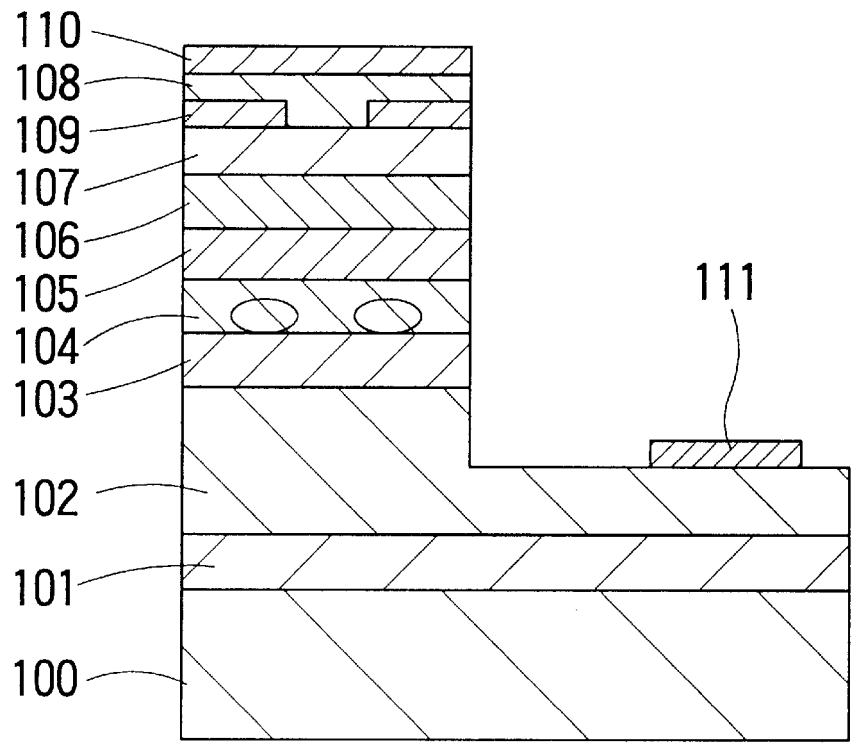
FIG. 1A is a cross-sectional view showing a nitride semiconductor light emitting device according to the first embodiment of the invention.

FIG. 1A is a cross-sectional view schematically showing a nitride compound semiconductor laser according to the first embodiment of the invention. Numeral 100 denotes a sapphire substrate, 101 is an n-type GaN buffer layer (Si-doped, $3\sim5\times10^{18}$cm$^{-3}$, 0.1 $\mu$m), 102 is an n-type GaN contact layer (Si-doped, $3\sim5\times10^{18}$cm$^{-3}$, 4 $\mu$m), 103 is an n-type AlGaN cladding layer (Si-doped, $5\times10^{17}$cm$^{-3}$, 0.3 $\mu$m), 104 is an n-type In$_{0.1}$Ga$_{0.9}$N/GaN multi-quantum well adjacent layer (Si-doped, $5\times10^{17}$cm$^{-3}$, well width of 2 nm, barrier width of 4 nm, three pairs), 105 is In$_{0.3}$Ga$_{0.7}$N/GaN multi-quantum well active layer (undoped, well width of 2 nm, barrier width of 4 nm, three pairs), 106 is a p-type GaN adjacent layer (Mg-doped, $5\times10^{17}$cm$^{-3}$, 0.1 $\mu$m), 107 is a p-type AlGaN cladding layer (Mg-doped, $5\times10^{17}$cm$^{-3}$, 0.3 $\mu$m), 108 is a p-type GaN contact layer (Mg-doped, $1\sim3\times10^{18}$cm$^{-3}$, 0.5 $\mu$m), 109 is an n-type GaN barrier layer (Si-doped, $1\times10^{18}$cm$^{-3}$, 0.3 $\mu$m), 110 is a p-side electrode, and 111 is an n-side electrode.

The semiconductor laser shown in FIG. 1A is fabricated in the process explained below. First grown on the sapphire substrate 100 are layers from the n-type GaN buffer layer 101 to the n-type GaN layer 109 by metal organic chemical vapor deposition (MOCVD) using organic metals. Next formed on the n-type GaN layer 109 is a mask (not shown) having a stripe-shaped aperture by photolithography, and etching is made until exposing the p-type AlGaN cladding layer 107. Then, the p-type GaN contact layer 108 is grown. After that, the p-type GaN contact layer 108 is selectively covered by a mask (not shown) having an aperture, and the semiconductor layers 108 to 102 are selectively removed by etching to expose the contact layer 102. Then, the mask is removed, and the n-side electrode 111 and the p-side electrode 110 are formed. Thus, the nitride semiconductor laser shown in FIG. 1A is obtained.

The n-side In$_{0.1}$Ga$_{0.9}$N/GaN multi-quantum well adjacent layer 104 (Si-doped, well width of 2 nm, barrier width of 4 nm, three pairs)is grown as follows. Setting the growth temperature to 760° C., and using TMI (trimethyl indium), TMG (trimethyl gallium), ammonium gas, an In$_{0.1}$Ga$_{0.9}$N layer is grown for eight seconds under a condition where the growth rate of 1 $\mu$m per hour will be obtained in growth of an ordinary thick film. As a result, a well layer of the thickness of 2 nm is formed. After a waiting time of one second, another layer is grown for 18 seconds under the condition for the same growth rate, using TMG (trimethyl gallium), ammonium gas and silane. As a result, a barrier layer of the thickness of 4 nm is formed. These steps are repeated three times to stack three pairs of well layers and barrier layers.

The multi-quantum well adjacent layer 104 actually made by the growth explained above was confirmed to include regions where the composition ratio of In is locally large in the in-plane direction of the layer.

Figure 1B:
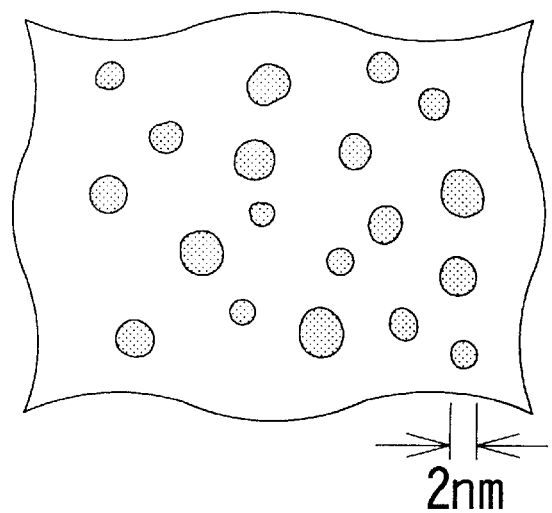
FIG. 1B is a diagram showing an in-plane distribution of emitted light in an adjacent layer.
Figure 2:
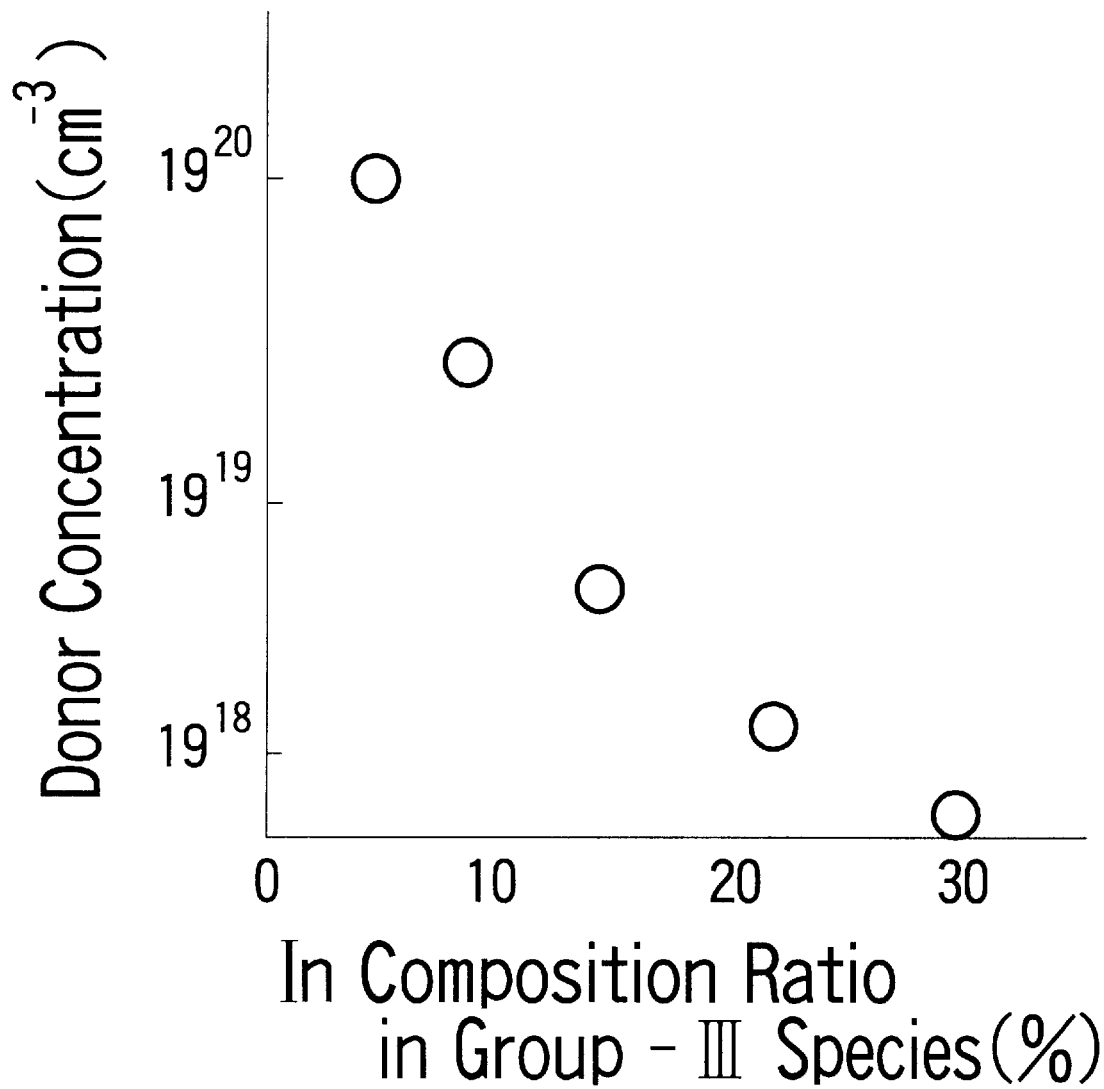
FIG. 2 is a graph showing changes in donor concentration with the In composition ratio of the adjacent layer in the nitride semiconductor light emitting device shown in FIG. 1A.

FIG. 1B is a schematic diagram showing the in-plane distribution of emission wavelengths in a well layer of the multi-quantum well adjacent layer 104 observed by a cathode luminescence method. That is, in regions shown by the spotting in FIG. 1B, emission of light with longer wavelengths than the remainder region was observed. In general, wavelengths of emitted light obtained by a cathode luminescence method vary with composition of the target. In this case, the larger the indium contained in the target, the longer the wavelength of the emitted light. Therefore, it was confirmed that the multi-quantum well adjacent layer 104 includes island regions with higher composition ratios of indium within the plane. As a result of more careful reviews of the distribution and emission wavelengths, it was found that each well layer of the multi-quantum well adjacent layer 104 have a number of island regions having diameters of approximately 2 nm and having In composition ratios in the group-III species of approximately 30%. These island regions contain larger amounts of In than the remainder region, and have substantially the same band gap as that corresponding to the emission wavelength from the active layer 105. Although the multi-quantum well layer 104 is doped with silicon (Si) as explained above, regions with higher indium concentrations are less likely to contain silicon as shown in FIG. 2, and hence have lower carrier concentrations.

Figure 3:
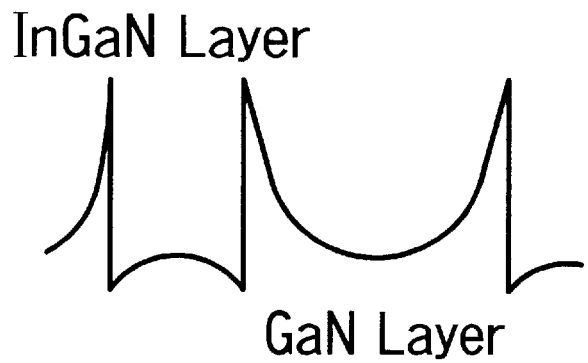
FIG. 3 is a schematic diagram showing the band structure of the adjacent layer in the nitride semiconductor light emitting device shown in FIG. 1A.

FIG. 3 is a schematic diagram showing a conduction band between a pair of InGaN well layer and a GaN barrier layer in the multi-quantum well adjacent layer 104. In FIG. 3, the thickness is of the adjacent layer 104 is taken in the transverse direction, and the energy level in the longitudinal direction. As illustrated, high-concentrated donors exist in the GaN layer, and the energy band is bent largely. When the energy band is bent as illustrated, confinement of carriers in the InGaN well layer in this location is weak against electrons with small effective masses, and no emission occurs. The emitted light from the active layer 105 is absorbed in portions with higher In composition ratios in the adjacent layer 104, the absorption occurs only in these small island regions. Therefore, the adjacent layer 104 is changed to a saturable absorptive condition which invites self-pulsation. The self-pulsation actually continued even under a high-output condition. Additionally, when silicon (Si), carbon (C), germanium (Ge), tin (Sn) or lead (Pb) was used as the n-type impurity of the adjacent layer 104, no adverse affection, such as an increase in threshold value, was observed.

The laser according to the embodiment actually operated for continuous oscillation with the threshold value of 20 mA. The emission wavelength was 40 nm, and the operation voltage was 3.8 V. The S/N ratio upon 50 mW was improved to 130 dB as compared with 20 dB of a conventional semiconductor laser. Moreover, while there was a difficulty in obtaining a high power with a conventional self-pulsation laser with a thick active layer with a saturable absorption layer close to the active layer, the laser according to the embodiment realized a stable output up to 200 mW in a transverse mode.

The Inventor made a review as to the ratio of self-pulsation in a number of nitride semiconductor lasers fabricated by the above-explained method according to the invention and having island absorption regions.

Figure 4:
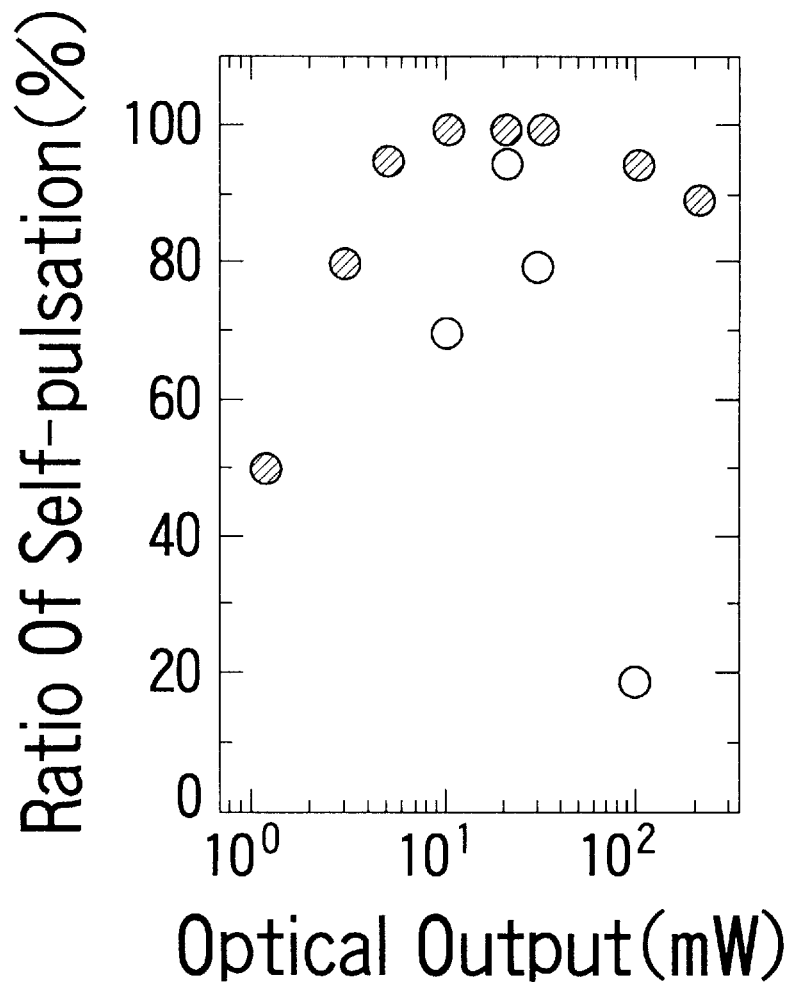
FIG. 4 is a graph showing the ratio of light by self-pulsation in all optical output of the nitride semiconductor light emitting device shown in FIG. 1A.

FIG. 4 is a graph showing the ratio of devices among the prepared nitride semiconductor light emitting devices in which self-pulsation occurred when they were operated varying optical outputs. In FIG. 4, the abscissa indicates optical outputs, and the ordinate indicates the percentage of nitride semiconductor light emitting devices where self-pulsation occurred. The hatched circles in FIG. 4 indicate nitride semiconductor light emitting devices according to the invention, and open circles indicate nitride semiconductor light emitting devices taken as comparative devices, which include a layered absorption region instead of an island absorption region. In greater detail, each of the comparative devices has a 10 nm-thick $In_{0.25}Ga_{0.75}N$ absorption layer outside a guiding layer when viewed from the active layer.

It is known from FIG. 4 that, while the ratio of devices inviting self-pulsation among the comparative devices is low and scattering, nitride semiconductor light emitting devices according to the invention having island absorption regions induce self-pulsation throughout all ranges of output power from a low output to a high output with a reliably higher probability.

Figure 5:
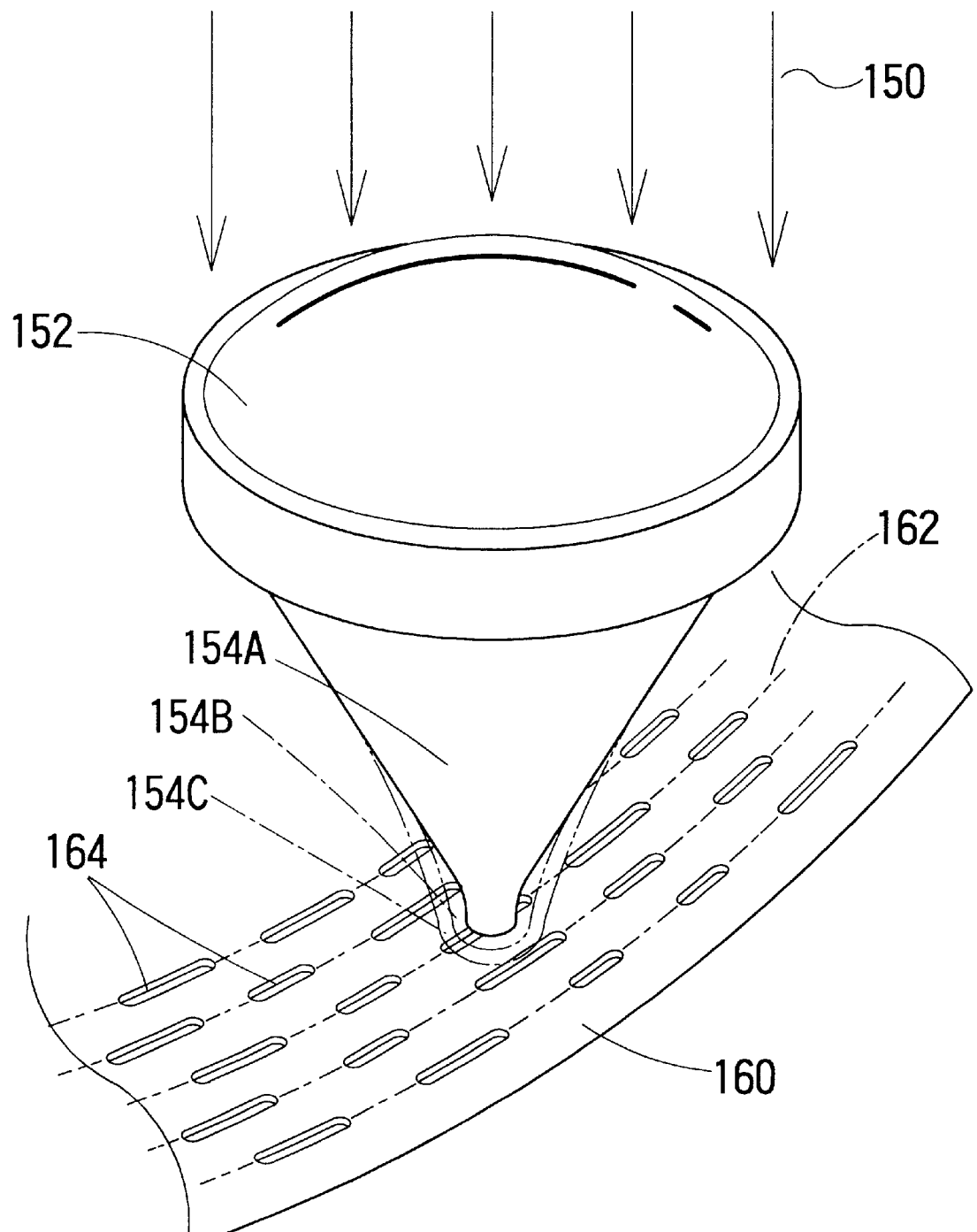
FIG. 5 is a schematic diagram illustrating the use of a semiconductor laser for reading data from an optical disc.

FIG. 5 is a schematic diagram illustrating a semiconductor laser in use for reading data from an optical disc. Laser light 150 is emitted from a semiconductor laser device (not shown), and converged and introduced onto an optical disc 160 through a lens 152. The optical disc 160 has formed on its surface concentric tracks 162, and bits 164 are aligned along the tracks 162. Depending upon the existence or absence of the bits 164, the reflectivity of the laser light converged by the lens 152 varies, and it is detected by a photo detector (not shown). When using a laser beam with the wavelength of 420 nm, which can be obtained by the nitride semiconductor laser according to the invention, the beam is converged by the lens as illustrated, and a very thin beam 154A is obtained. For comparison purposes, FIG. 4 also shows a laser beam 154B in a conventional DVD system (wavelength of 650 nm, NA=0.6) and a laser beam 154C of a conventional compact disc system (wavelength of 780 nm, NA=0.45). As apparently known from FIG. 4, nitride semiconductor lasers according to the invention promise a well converged laser beam thin enough to decrease the distance between tracks 162 and the distance between bits 164 on the optical disc 160. As a result, the invention enables a recording capacity as large as three times of the capacity of conventional DVD systems.

Moreover, the nitride semiconductor laser makes it possible to commonly use a single nitride semiconductor laser for both reading and writing data on and from an optical recording medium. That is, the semiconductor laser according to the invention promises stable data reading with a low noise because self-pulsation occurs easily, and it is operative for writing data because it is operative for a high output. This contributes to remarkable structural simplification of a pickup head for integrated use in data reading and writing.

Although the multi-quantum well adjacent layer 104 in the foregoing example includes three pairs of well layers and barrier layers, any other number of pairs may be chosen, depending on the thickness of the layer and the composition ratio of In. The barrier layer may be made of any other material including In, Al, and/or the like, in lieu of GaN.

Next explained is the second embodiment of the invention.

Figure 6A:
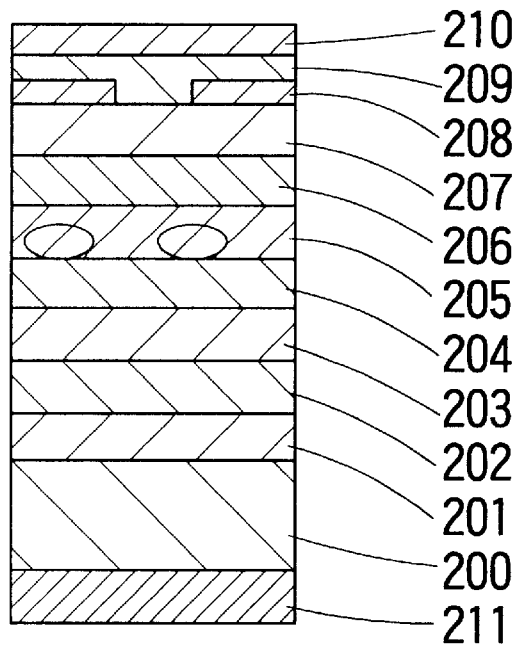
FIG. 6A is a cross-sectional view of a nitride semiconductor light emitting device taken as the second embodiment of the invention.

FIG. 6A is a schematic cross-sectional view showing a general construction of a nitride semiconductor laser according to the second embodiment. Numeral 200 denotes a p-type SiC substrate, 201 is a p-type AlN buffer layer (Mg-doped, $3\sim5\times10^{20}$cm, 0.1 µm), 202 is a p-type GaN layer (Mg-doped, $1\times10^{19}$cm$^{-3}$, 4 µm), 203 is a p-type $Al_{0.3}Ga_{0.7}N$ cladding layer (Mg-doped, $5\times10^{17}$cm$^{-3}$, 0.3 µm), 204 is an $Al_{0.1}Ga_{0.9}N$ adjacent layer (undoped, 0.1 µm), 205 is a multi-quantum well active layer $In_{0.1}Ga_{0.9}N/Al_{0.1}Ga_{0.9}N$ (undoped, well width of 1 nm, barrier width of 2 nm, three pairs), 206 is an $Al_{0.1}Ga_{0.9}N$ adjacent layer (undoped, 0.1 µm), 207 is an n-type $Al_{0.3}Ga_{0.7}N$ cladding layer (Si-doped, $5\times10^{17}$cm$^{-3}$, 0.3 µm), 208 is a p-type GaN current confining layer (Mg-doped, $5\times10^{17}$cm$^{-3}$, 0.1 µm), 209 is an n-type GaN contact layer (Si-doped, $1\sim3\times10^{19}$cm$^{-3}$, 0.1 µm), 210 is an n-side electrode, and 211 is a p-side electrode.

The nitride semiconductor laser is fabricated in the following process. Layers up to the p-type GaN current confining layer 208 are first grown in the substrate 200 by MOCVD. Then, a stripe-shaped masks (not shown) are formed on the p-type GaN current confining layer 208 by photolithography, and etching is made until exposing the n-type $Al_{0.3}Ga_{0.7}N$ cladding layer 207. Next grown is the p-type GaN contact layer 209. After making electrodes on opposite surfaces, cavity facets are formed by cleavage.

In this embodiment, also the $In_{0.1}Ga_{0.9}N/Al_{0.1}Ga_{0.9}N$ multi-quantum well active layer 205 is made in a process similar to the process used to make the multi-quantum well adjacent layer 104 in the first embodiment. More specifically, using TMG, TMI and ammonium gas for growth of InGaN and TMA (trimethyl aluminum), TMG and ammonium gas for growth of AlGaN layers, setting the growth temperature to 860° C., V/III ratio of materials to approximately 170, and putting the waiting time of one second after growth of one layer to growth of a next layer, the growth sequence of InGaN and AlGaN layers are repeated three times. As a result, the multi-quantum well layer with the well thickness of 1 nm, barrier thickness of 2 nm, and three pairs is obtained.

In this process, regions locally higher in indium (In) composition ratio are formed in well layers of the multi-quantum well active layer 205. More specifically, an in-plane distribution of a number of island regions with the diameter of approximately 70 nm and the In composition ratio of approximately 20% is formed. Due to the higher indium concentration than the remainder region, a distortion caused by a deviation in lattice constant occurs in these regions. As a result, although a larger amount of In is contained, the difference in band gap from the surrounding region is as small as 10 meV. When a current is injected to the semiconductor laser, efficient emission occurs in these island regions with higher In composition ratios because they contain less Si as the dopant and have a lower electrical conductivity.

Figure 6B:
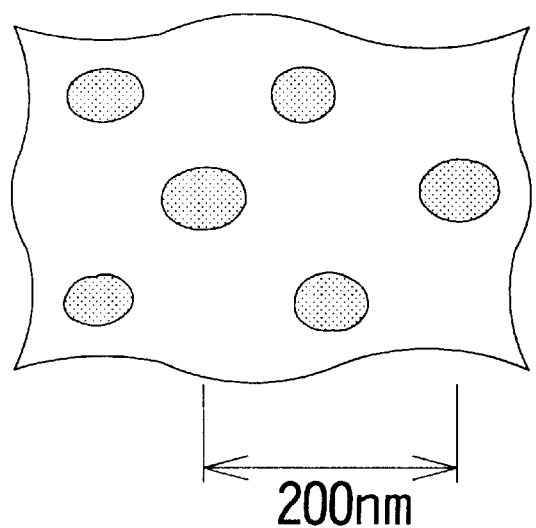
FIG. 6B is a schematic diagram showing the configuration of an active layer observed through a transmission electron microscope.

FIG. 6B is a schematic diagram showing an aspect of the active layer 205 observed by a transmission electron microscope. In the active layer 205, island regions with a high In concentration than the surrounding region are regularly aligned in in-plane directions. The diameter of regions with a higher indium concentration is approximately 70 nm, and the their distance is approximately 200 nm. As a result of experiments made by the Inventor, it was found that the distance between these island regions can be controlled by adjusting the growth conditions.

Putting n for the refractive index of the portion surrounding the island regions and $\lambda$ for the emission wavelength of the high-concentrated regions, when d=$\lambda$m/2n (m=1, 2, 3, 4), self-pulsation occurred most reliably. When m being larger than 4, the reliability of self-pulsation decreased, probably because many of a number of oscillation modes are selected.

It has been found that, without using a complicated structure as that of a distributed feedback laser, the embodiment induces self-pulsation, suppresses mode hopping and decreases the noise.

Figure 7:
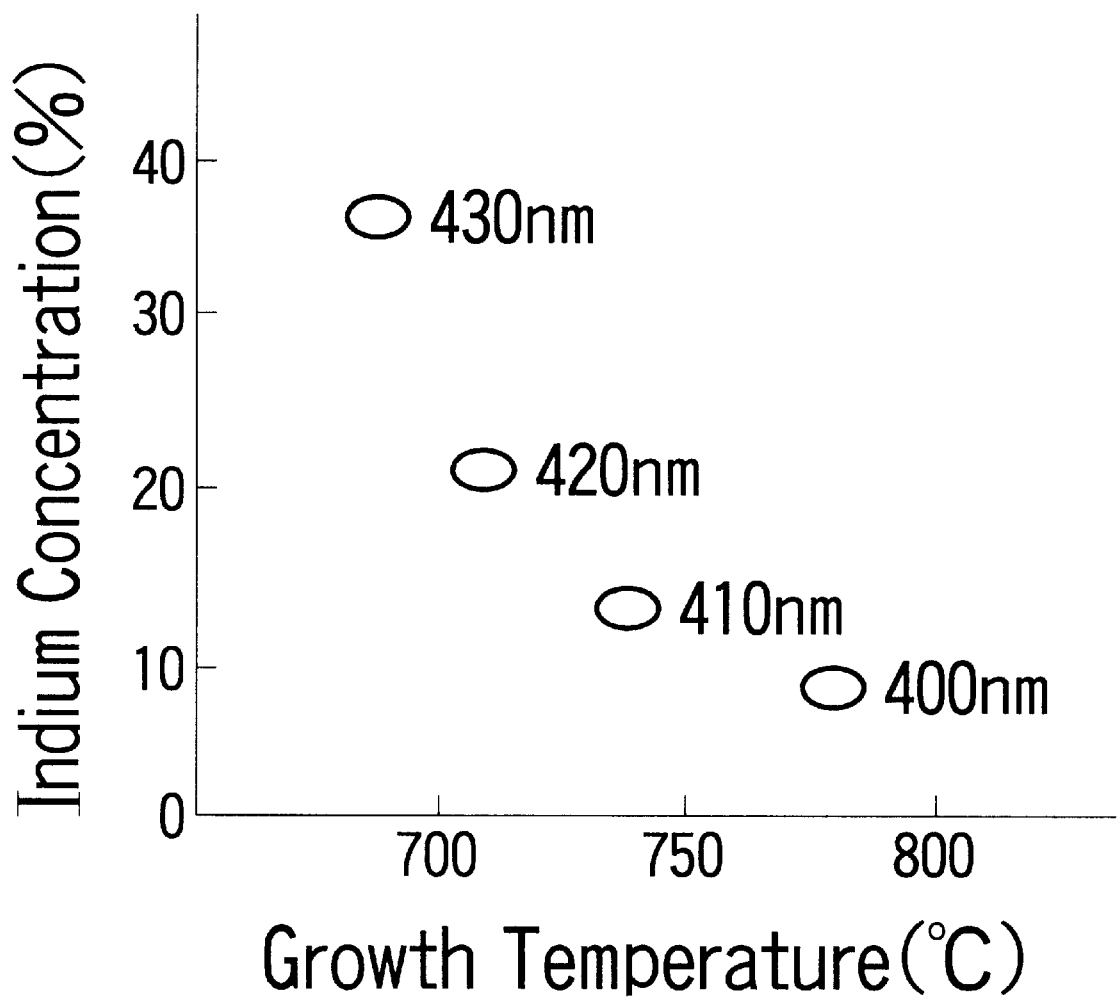
FIG. 7 is a graph showing optimum conditions for manufacturing the nitride semiconductor light emitting device shown in FIG. 6A.

FIG. 7 is a graph showing optimum conditions for growth for obtaining emission wavelengths from 400 to 430 nm. In FIG. 7, taking growth temperatures (° C) on the abscissa and In-contained ratios on the ordinate, the graph shows optimum conditions of In-contained ratios in the solid phase and growth temperatures for different emission wavelengths.

Island regions with a higher indium concentration formed in the active layer contain less donor. Therefore, the island regions exhibit a higher emission efficiency, and promotes stable existence of exciton dipoles with a high emission efficiency by quantum confinement. As a result, although the island regions with a higher In concentration is small in volume, they form a population inversion sufficient for laser oscillation. Although the lower In-concentrated region surrounding the higher In-concentrated island regions has a larger band gap than that of the island regions, since it contains more donor, it behaves as a saturable absorption layer to exhibit a self-pulsating state due to absorption to the level of the donor. This state actually continued even when operated for a high output.

Impurities doped into the active layer other than Si, C. Ge, Sn and Pb making an n-type resulted in increasing the threshold value, and are therefore considered practically unsuitable. In contrast, especially when Si is used, a high emission efficiency was attained.

With a semiconductor laser having the above-explained structure, oscillation of the emission wavelength of 375 nm in the fundamental transverse mode under the threshold value of 10 mA was actually confirmed, and its operation was stable at least up to 5000 hours. Although the embodiment uses a SiC substrate, any other conductive substrate may be used. Using a ZnO substrate, more excellent current-to-voltage characteristics were obtained. The current confining layer 208 may be located on the other side of the active layer closer to the substrate 200, or current confining layers 208 may be provided on both sides of the active layer 205. The material of the current confining layer may be one having a higher refractive index than that of the contact layer.

Next explained is the third embodiment of the invention.

Figure 8:
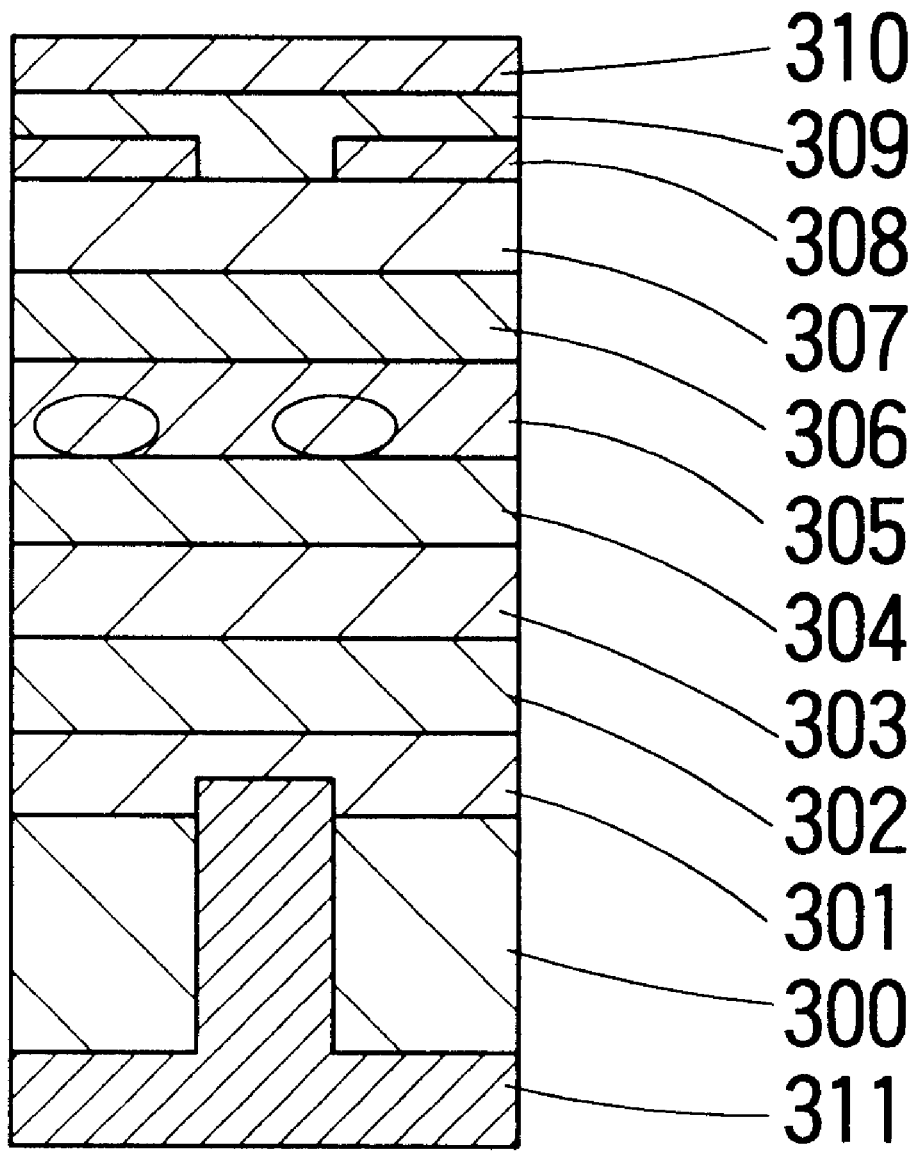
FIG. 8 is a cross-sectional view of a nitride semiconductor light emitting device taken as the third embodiment of the invention.

FIG. 8 is a cross-sectional view of a nitride semiconductor laser according to the third embodiment of the invention.

Numeral 300 denotes a sapphire substrate, 301 is a GaN buffer layer (0.01 $\mu$m), 302 is a p-type GaN contact layer (Mg-doped, 3~5×10$^{18}$cm$^{-3}$, 1 $\mu$m), 303 is a p-type Al$_{0.2}$Ga$_{0.8}$N cladding layer (Mg-doped, 5×10$^{17}$cm$^{-3}$, 0.3 $\mu$m), 304 is a p-type GaN adjacent layer (Mg-doped, 5×10$^{17}$cm$^{-3}$, 0.1 $\mu$m), 305 is an In$_{0.3}$Ga$_{0.7}$N/GaN multi-quantum well active layer (undoped, well width of 2 nm, barrier width of 4 nm, three pairs), 306 is an n-type GaN barrier layer (Si-doped, 5×10$^{17}$cm$^{-3}$, 0.1 $\mu$m), 307 is an n-type Al$_{0.2}$Ga$_{0.8}$N cladding layer (Si-doped, 5×10$^{17}$cm$^{-3}$, 0.3 $\mu$m), 308 is a p-type GaN conduction barrier layer (Mg-doped, 1×10$^{18}$cm$^{-3}$, 0.3 $\mu$m), 309 is an n-type GaN contact layer (Si-doped, 1~3×10$^{18}$cm$^{-3}$, 0.5 $\mu$m), 310 is an n-side electrode and 311 is p-side electrode.

Figure 9A:
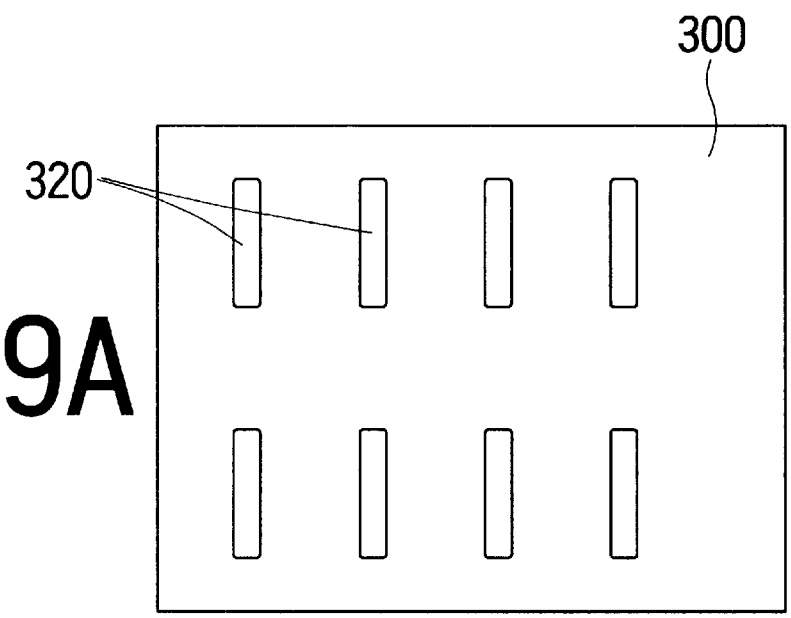
FIG. 9A is a plan view roughly showing the structure of a substrate used in the nitride semiconductor light emitting device shown in FIG. 8.
Figure 9B:
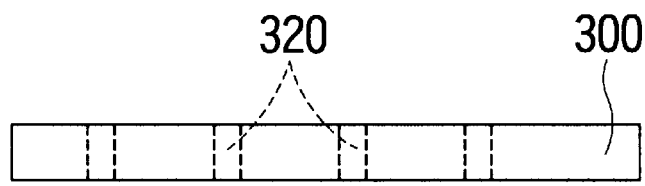
FIG. 9B is a side elevation roughly showing the structure of the substrate used in the nitride semiconductor light emitting device shown in FIG. 8.

Briefly explained is a method for fabricating the laser shown in FIG. 8. MOCVD was used for crystal growth. First grown by MOCVD is the GaN buffer layer 301 on the sapphire substrate 300 which has formed slits 320 as shown in FIGS. 9A and 9B. The size of each slit 320 may be, for example, approximately 250 $\mu$m×30 $\mu$m, and the distance between slits may be approximately 250 $\mu$m.

In this example, the GaN buffer layer 301 is grown on the sapphire substrate 300 under conditions expediting the lateral growth rate. That is, by setting the growth temperature sufficiently high relative to the GaN supply rate, migration of GaN atoms on the substrate surface is enhanced. By growing the buffer layer 301 under these conditions, the slits 302 in the sapphire substrate 300 are covered with the GaN buffer layer 301.

After that, layers from the p-type GaN contact layer 302 through the p-type GaN conduction barrier layer 308 are grown sequentially under ordinary growth conditions. After the p-type GaN conduction barrier layer 308 is grown, stripe-shaped masks (not shown) are formed to partially cover the p-type GaN barrier layer 308, and it is selectively removed by etching until exposing the n-type Al$_{0.2}$Ga$_{0.8}$N cladding layer 307. Then, the mask is removed, and the n-type GaN contact layer 309 is grown. The n-side electrode 310 is formed on the contact layer 309 by vapor deposition of Ni and Au. The GaN buffer layer 301 is etched from the bottom of the substrate 300, and the p-side electrode 311 is made by vapor deposition of Pt, Ti and Au in sequence. To obtain laser elements, the product is cleaved to make facets (not shown), and semiconductor light emitting devices are separated by dicing to obtain the semiconductor lasers as shown in FIG. 8. Although not shown, a high reflective coat in form of a multi-layered dielectric film is applied onto the facet.

Next explained specific conditions for growth of the In$_{0.2}$Ga$_{0.8}$N/GaN multi-quantum well active layer 301. Setting the growth temperature to 740° C., TMG, TMI and ammonium gas is used for growth of InGaN layers, and TMG and ammonium gas is used for growth of AlGaN layers. InGaN well layers are grown for 7 seconds under the conditions for the growth rate of 1 $\mu$m in terms of growth of a thick film of In$_{0.2}$Ga$_{0.8}$N, and GaN barrier layers are grown for 20 seconds, stopping the supply of TMI. The waiting time of 1.5 seconds is interposed between growth of each InGaN well layer and growth of each GaN barrier layer. There is a difference in growth rate between a thick film and a thin film, such as quantum well layer, even when they are grown under the same growth conditions, because the growth rates are different in initial stages of the growth. As a result of the growth explained above, regions locally high in indium (In) composition ratio are formed in well layers of the multi-quantum well active layer 305. More specifically, a number of island regions with the diameter of approximately 2 nm and the In composition ratio in the group-III species of approximately 30% are formed. Due to the higher concentration of In than the remainder region, a distortion caused by deviation in lattice constant occurs in these regions. As a result, although a larger amount of In is contained, the difference in band gap from the surrounding region is as small as 10 meV. When a current is injected to the semiconductor laser, these island regions with higher In composition ratios contain less dopant Si, which results in a lower electric conductivity, and carriers are injected mainly into the surrounding region.

Figure 10:
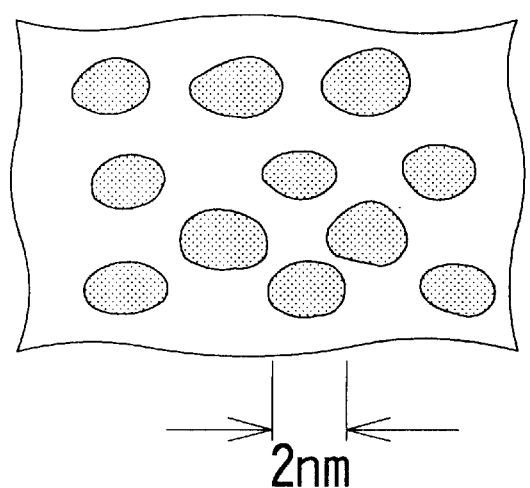
FIG. 10 is a schematic diagram showing the configuration of an active layer 305 observed through a transmission electron microscope.

FIG. 10 is a schematic diagram showing an aspect of the active layer 305 observed through a transmission electron microscope. That is, as a result of observation of the lattice image by the transmission electron microscope, it was found that the active layer 305 includes scattered island regions with a diameter on the order of nm. By characteristic X-rays spectroscopy to examine the composition of the island regions, it was found that the In concentration is higher than the surrounding region. Additionally, emission points in a regular alignment corresponding to these island regions were observed by cathode luminescence.

The reason why the island regions are formed probably lies in that InGaN lattice-mismatching from GaN grows in form of islands on GaN. The Inventor prepared samples with island regions under various growth conditions, and reviewed relations between diameters of the island regions and external quantum efficiencies of semiconductor lasers.

Figure 11:
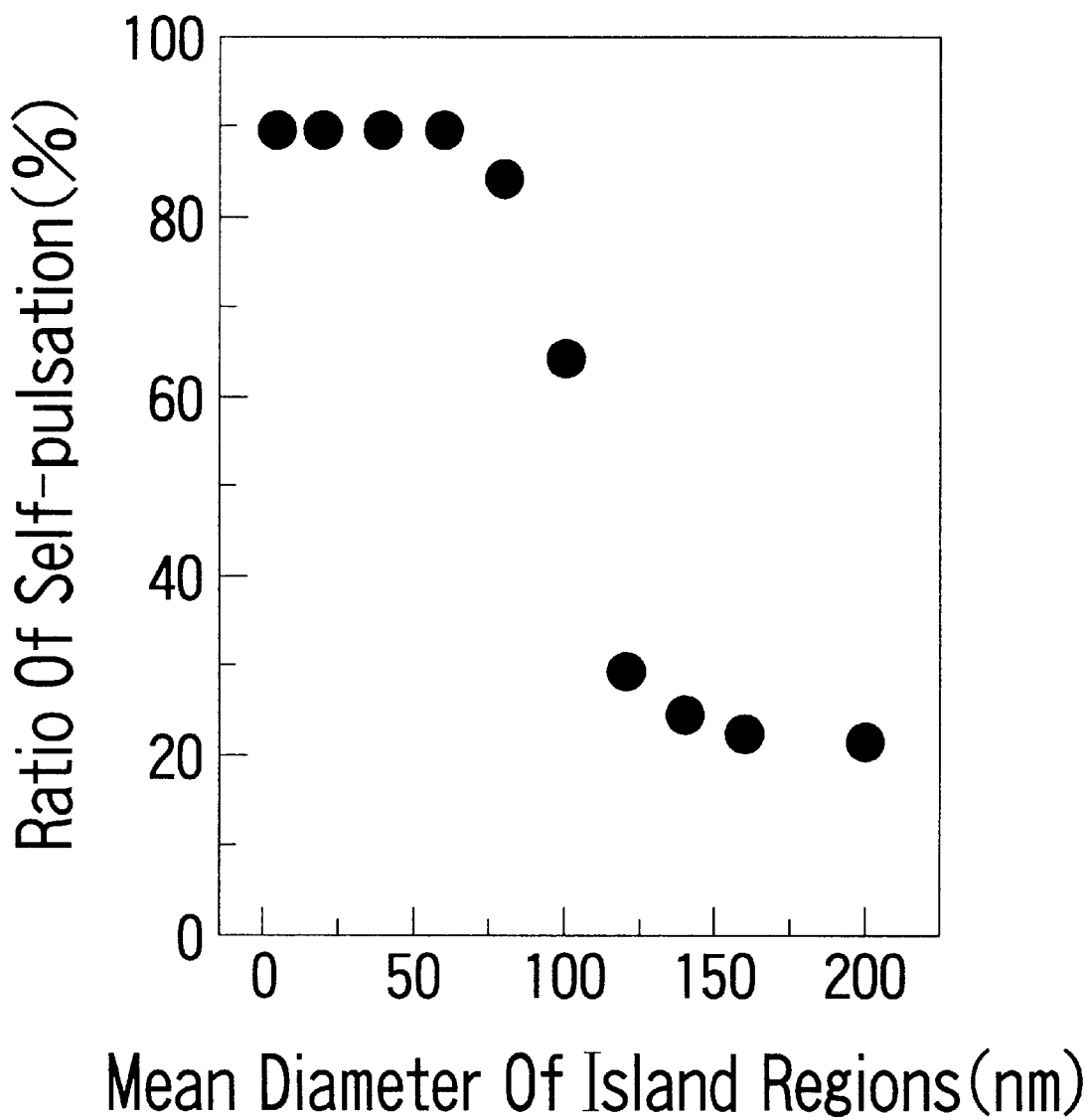
FIG. 11 is a graph showing changes in ratio of self-pulsation with mean diameter of island regions in the active layer of the nitride semiconductor light emitting device shown in FIG. 8.

FIG. 11 is a graph showing the ratio of devices among the prepared nitride semiconductor lasers in which self-pulsation occured against the mean size of island regions thereof. In FIG. 11, the ordinate indicate the ratio of the self-pulsation, and the abscissa indicate the mean diameter of island regions. As illustrated, the ratio of devices among the prepared semiconductor lasers tends to increase as the diameter of island regions becomes smaller. In order to obtain a particularly high ratio of self-pulsation, the diameter of the island region is preferably 100 nm or less. If the diameter of the island region is greater, the ratio of self-pulsation largely decreases as shown in FIG. 11.

The Inventor also made a careful review on two-dimensional distribution of indium concentration in island regions and the surrounding region. It has been confirmed that island regions with a diameter of 100 nm or less cannot exist unless the indium concentration changes along edges of the island regions by the rate of 10% or more per 2 nm. That is, when there is such or steeper increase in indium concentration along edges of island regions, those with a diameter of 100 nm or less can exist.

High In-concentrated island regions in the active layer contain less donor, and exhibit a higher emission efficiency. Additionally, the quantum-confining effect expedites the stable presence of exciton dipoles with a high emission efficiency. Therefore, although the high In-concentrated island regions is small in volume, they form a population inversion sufficient for oscillation. Although the lower In-concentrated region surrounding the higher In-concentrated island regions has a larger band gap than that of the island regions, since it contains more donor, it behaves as a saturable absorption layer to exhibit a self-pulsating state due to absorption to the level of the donor. This self-pulsating state actually continued even when operated for a high output.

Impurities doped into the active layer other than Si, C. Ge, Sn and Pb making an n-type resulted in increasing the threshold value, and are therefore considered practically unsuitable.

In the laser according to the embodiment, there occurs extremely few dislocation and defects because it includes the GaN buffer layer 301 grown in the lateral direction. As a result, leak current is suppressed, and failure of the semiconductor light emitting device seldom occurs.

With a semiconductor laser having the above-explained structure, continuous oscillation of the emission wavelength of 420 nm under the threshold value of 20 mA at a room temperature was actually confirmed. The operation voltage was 3.8 V. The S/N ratio of the semiconductor laser during operation for 50 mW was remarkably improved by self-pulsation to 130 dB as compared with 20 dB of a conventional semiconductor laser. In addition, since the active layer has a quantum well structure, the laser can realize an output as high as 200 mW when operated in the self-pulsation mode, or as high as 300 mW when self-pulsation is not maintained. As a result of a life test, the life of the semiconductor light emitting device was estimated to be beyond 100,000 hours, and realization of low noise, high power and high reliability was confirmed.

Although the embodiment uses a sapphire substrate, any other appropriate material, such as quartz glass, diamond or BN, may be used. If MBE (molecular beam epitaxy) is used for growth, Pyrex or ZnO may be used as the substrate.

Next explained is the fourth embodiment of the invention.

Figure 12:
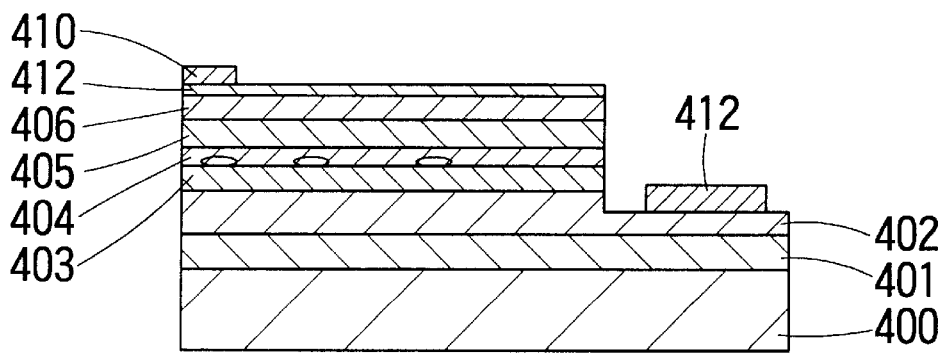
FIG. 12 is a cross-sectional view of a nitride semiconductor light emitting device taken as the fourth embodiment of the invention.

FIG. 12 is a diagram for explaining a general construction of a nitride semiconductor light emitting diode (LED) taken as the fourth embodiment of the invention. In FIG. 12, numeral 400 denotes a sapphire substrate, 401 is a GaN buffer layer ($3 \sim 5 \times 10^{18} cm^{-3}$, 4 μm), 402 is an n-type GaN contact layer (Si-doped, $1 \times 10^{18} cm^{-3}$, 2 μm), 403 is an n-type GaN layer (Si-doped, $5 \times 10^{17} cm^{-3}$, 0.1 μm) 404 is an $In_{0.3}Ga_{0.7}N$/GaN MW active layer (Si-doped, well width of 2 nm, barrier width of 4 nm), 405 is a p-type GaN layer (Mg-doped, $5 \times 10^{17} cm^{-3}$, 0.1 μm), 406 is a GaN contact layer (Mg-doped, $3 \times 10^{18} cm^{-3}$, 0.05 μm), 410 is a p-side electrode, 411 is an n-side electrode, and 412 is an ITO indium tin oxide) transparent electrode.

Semiconductor layers as shown in FIG. 12 were grown by MOCVD. In the process for growing the active layer 404, incorporating interruption of growth for one second to three seconds after growth of each $In_{0.3}Ga_{0.7}N$ well layer, higher In-concentrated island regions were made. The other layers were grown in an ordinary manner. After the growth of the layers, masking the portion to form the p-side electrode, the product was dry-etched into a mesa configuration until exposing the n-type GaN contact layer 402. After removing the mask, $SiO_2$ was applied onto side surfaces of the mesa structure or other portions liable to cause a leak current. Next the transparent electrode was formed on the entire top surface of the mesa structure, the p-side electrode 410 was formed on a part of the transparent electrode most distant from the n-side electrode, and the n-side electrode 412 was formed on the GaN contact layer.

A light emitting device made in this manner was broken, and the portion of the active layer was taken for observation by a transmission electron microscope. Here again, like the former embodiments, island regions higher in In concentration than the surrounding region were observed in well layers. These regions had diameters of approximately 4 nm. Additionally, it was found by a characteristic X-rays spectrum analysis that island regions contain a larger amount of In by approximately 10% than the surrounding region.

The operation voltage of the device was 2.7 V, and its optical output was 10 mW under 10 mA and 50 mW under 100 mA. Also the emission efficiency was good, and the external quantum efficiency reached 30%. Realization of the device with a high efficiency and a high emission intensity relies on the phenomenon that carriers injected into high In-concentrated regions in the active layer are confined in the high In-concentrated regions to recombine only for emission without running into useless recombination for emission.

Although the embodiment realizes a blue light emission, if the amount of In in the active layer is increased to adjust the band gap, light of various wavelengths to one close to red light can be emitted. Thus, a GaN-based full-color light emitting device using red, green and blue three primary colors can be realized.

Next explained is the fifth embodiment of the invention.

Figure 13:
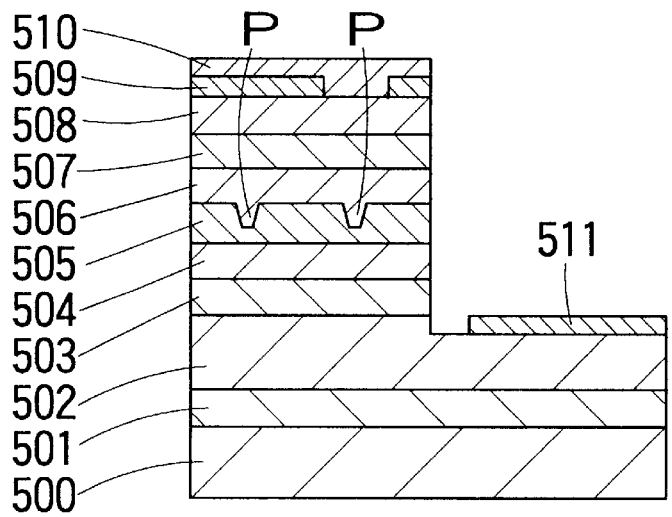
FIG. 13 is a cross-sectional view of a nitride semiconductor light emitting device taken as the fifth embodiment of the invention.

FIG. 13 is a diagram for explaining a general construction of a nitride semiconductor light emitting device taken as the fifth embodiment of the invention. In the light emitting device shown in FIG. 13, sequentially stacked on a sapphire substrate are a buffer layer 501, n-type GaN contact layer 502 (Si-doped, 3~5×10$^{18}$cm$^{-3}$4 $\mu$m), n-type AlGaN cladding layer 503 (Si-doped, 5×10$^{17}$cm$^{-3}$, 0.3 $\mu$m), non-doped GaN adjacent layer 504 (0.1 $\mu$m), InGaN multi-quantum well (MW) active layer 505, non-doped GaN adjacent layer 506 (0.1 $\mu$m), p-type AlGaN cladding layer 507 (Mg-doped, 5×10$^{17}$cm$^{-3}$, 0.3 $\mu$m), p-type GaN contact layer 508 (Mg-doped, 5×10$^{18}$cm$_{-3}$, 0.5 $\mu$m), and SiO$_2$ (silicon dioxide) film 509. Numeral 510 is a p-side electrode, and 511 is an n-side electrode.

The device is fabricated in the process explained below. First grown on the substrate 500 is the buffer layer 501 by MOCVD. Next, setting the growth temperature to 1100° C. and using TMG (trimethyl gallium, TMA (trimethyl aluminum), ammonium, silane, hydrogen and nitrogen, the n-type GaN contact layer 502, n-type AlGaN cladding layer 503 and non-doped GaN adjacent layer 504 are stacked sequentially.

After that, stopping the supply of group III source material gas, the substrate temperature is decreased to 760° C. Maintaining this temperature, and supplying TMG held at −15° C. together with hydrogen gas as the carrier gas by the flow rate of 10 cc/min, ammonium by the flow rate of 10 L/min at 20° C., and nitrogen by the flow rate of 19.7 L/min, and additionally supplying TMI (trimethyl indium) at 37° C. together with nitrogen as the carrier gas by the flow rate of 500 cc/min or 15 cc/min which are switched 20 times every 1.5 minutes approximately, the InGaN multi-quantum well active layer 505 is grown.

After that, the growth is once stopped by interrupting the supply of TMG and TMI. Then, while supplying hydrogen by the flow rate of 40 cc/min, nitrogen by 19.96 L/min, and ammonium by 10 L/min, the product is heated to 1100° C. in four minutes. After that, maintaining the temperature at 100° C., and supplying hydrogen by 500 cc/min, nitrogen by 14.5 L/min, TMG by 100 cc/min and ammonium by 10 L/min, the non-doped GaN adjacent layer 506 is stacked. Subsequently, the p-type G\AlGaN cladding layer 507 is formed by adding Cp2Mg (bis-cyclopentadienile magnesium) and TMA, and the p-type GaN contact layer 508 is stacked by stopping the supply of TMA.

After that, through steps of stacking the SiO$_2$ film 509, photolithography, etching, vapor deposition of the p-side electrode 510 and the n-side electrode 511, alloying, and so forth, the nitride semiconductor light emitting device shown in FIG. 13 is completed.

In the steps explained above, the growth temperature is decreased to 760° C. after the growth of the adjacent layer 504. The temperature is preferably determined within the range from 700° C. to 850° C. for the reason explained below.

In order to research conditions for growth of InGaN, the Inventor made growth of InGaN at various growth temperatures, setting the total flow rate of source material gas and carrier gas to 30 liters per minute, and setting the flow ratio of group-V element and group-III element to 8400. Then, the inventor examined the samples by photo luminescence (PL), and obserbed sufficiently intensive PL emission in the range of the growth temperatures between 700° C. and 850° C., as shown in Table 1. When the growth temperature decreases below 700° C., the growth does not progress sufficiently, and the PL luminous intensity does not increase. When the growth temperature exceeds 850° C., the PL luminous intensity significantly decreases due to a thermal damage.

TABLE 1

| Growth Temperature (° C.) | PL luminous intensity (arbitrary scale) |
| --- | --- |
| 600 | 0.5 |
| 625 | 0.5 |
| 650 | 0.7 |
| 675 | 1.3 |
| 700 | 6.7 |
| 725 | 8.6 |
| 750 | 9.5 |
| 775 | 9.5 |
| 800 | 8.3 |
| 825 | 7.0 |
| 850 | 6.5 |
| 875 | 0.9 |
| 900 | 0.3 |

The Inventor next made a research on the dependency upon mol flow rate ratio of group-V elements and group-III elements by fixing the growth temperature at 760° C. and setting the total flow rate of source material gas and carrier gas to 30 liters per minute. As a result, as shown in Table 2, sufficiently intensive PL emission was recognized when the mol flow rate ratio of group-V elements and group-III elements is not lower than 1000 and not higher than 15000. When the mol flow rate ratio of group-V elements and group-III elements is lower than 1000, reaction of elements is not sufficient, and the PL luminous intensity does not increase. When the mol flow rate ratio of group-V elements and group-III elements exceeds 15000, reaction of group-III elements is disturbed by group-V elements which intrude into and react on crystal lattices to be occupied by group-III elements, and the PL luminous intensity extremely decreases.

TABLE 2

| V/III ratio | PL luminous intensity (arbitrary scale) |
| --- | --- |
| 700 | 0.3 |
| 1000 | 6.7 |
| 3000 | 7.5 |
| 5000 | 9.2 |
| 8400 | 10 |
| 11500 | 7.3 |
| 17000 | 0.5 |

The inventor also made a research on the dependency upon the flow rate per minute of all source material gases and carrier gases, fixing the growth temperature at 760° C. and setting the flow rate ratio of group-V elements and group-III elements to 8400. As a result, as shown in Table 3, sufficiently intensive PL emission was recognized when the total flow rate per minute is not less than 10 liters and not more than 50 liters. When the total flow rate per minute is less than 10 liters, the PL luminous intensity does not increase due to insufficient reaction. When the total flow rate per minute exceeds 50 liters, the PL luminous intensity significantly decreases because the flow rate of source material gas is too fast to provide a sufficient time for reaction.

TABLE 3

| Total flow rate (liters per minute) | PL luminous intensity (arbitrary scale) |
|---|---|
| 5 | 0.2 |
| 10 | 5.7 |
| 15 | 6.3 |
| 20 | 7.5 |
| 25 | 9.2 |
| 30 | 10 |
| 35 | 9.5 |
| 40 | 8.2 |
| 45 | 7.3 |
| 50 | 5.3 |
| 55 | 0.2 |

In this embodiment, intentional doping is not made into the InGaN multi-quantum well active layer 505 and the non-doped GaN adjacent layer 506. Through experiment made by the Inventor, it has been confirmed that the GaN has a higher resistance than the InGaN layer when they are grown as explained above. It was also found by careful review of a cross-section of the grown layers through TEM (transmission electron microscope) that the InGaN multi-quantum well active layer 505 contains hole regions (pits) and that the non-doped GaN adjacent layer 506 fills these pits to flush the surface. Therefore, according to the embodiment, self-pulsation occurs due to the mechanism explained below.

That is, due to the existence of pit regions in the active layer, the current flowing in the active layer make a distribution, and low current density regions become saturable absorption regions where self-pulsation occurs.

This will be explained later in greater detail.

Figure 14:
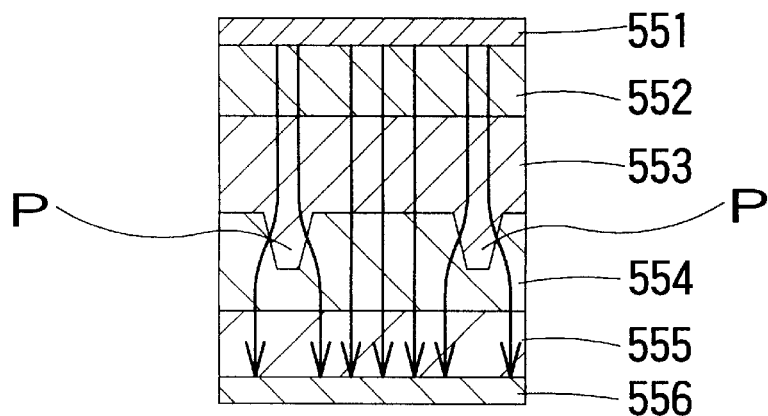
FIG. 14 is a cross-sectional schematic diagram showing the flow of injected current in the light emitting device according to the fifth embodiment.

FIG. 14 is a cross-sectional schematic diagram showing the flow of injected current in the light emitting device according to the embodiment. For simplicity, here is shown a simplified aspect of the structure of the light emitting device shown in FIG. 13. As shown in FIG. 14, the structure includes the heterojunction of the non-doped GaN layer 553 and the non-doped InGaN layer 554, and the non-doped InGaN layer 554 has pits P along the interface. Connected to these layers are the p-side electrode 551 and the n-side electrode via the p-type contact layer 552 and the n-type contact layer 555, respectively.

Let a forward voltage be applied to both electrodes. Then, since the band gap of the non-doped GaN layer 553 is larger than that of the non-doped InGaN layer 554, the current flows along the arrow-marked path in FIG. 14, and the current density of the InGaN layer 554 under the pit regions becomes lower than the current density of the other region.

Figure 15:
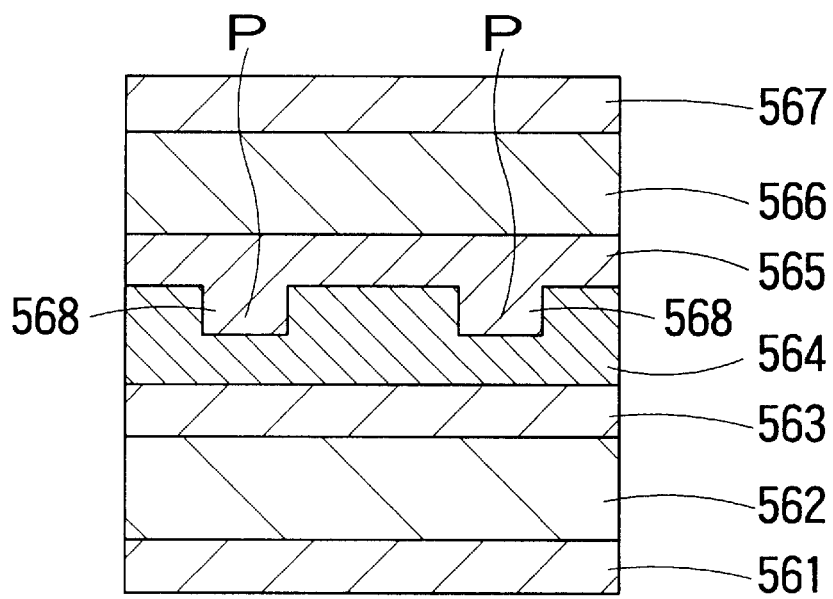
FIG. 15 is a cross-sectional schematic view of a multi-layer structure by simulation.

For the purpose of proving the phenomenon, the Inventor made a two-dimensional simulation, and reviewed the distribution of the current. FIG. 15 shows the layer structure used as a model in the simulation. The layer structure was prepared as a model of a laser structure, stacking a 0.1 $\mu$m thick n-type GaN contact layer 561 doped by $5 \times 10^{18} cm^{-3}$, 0.3 $\mu$m thick n-type $Al_{0.15}Ga_{0.85}N$ cladding layer 562 doped by $5 \times 10^{17} cm^{-3}$, 0.1 $\mu$m thick non-doped GaN adjacent layer 563, 0.1 $\mu$m thick non-doped $In_{0.08}Ga_{0.92}N$ active layer 564, 0.1 $\mu$m thick non-doped adjacent layer 565, 0.3 $\mu$m thick p-type $Al_{0.15}Ga$ N cladding layer 566, and 0.1 $\mu$m thick p-type GaN contact layer 567. The non-doped $In_{0.08}Ga_{0.92}N$ active layer 564 had formed pit regions 568 having the width of 0.1 $\mu$m and the depth of 0.05 $\mu$m in alignment with the distance of 1 $\mu$m along the interface with the non-doped GaN adjacent layer 565. Although the pits regions actually made are not usually rectangular, simulation was made using rectangular pit regions for simplicity. Of course, a difference in shape of pit regions does not essentially affect the result of the simulation.

Figure 16:
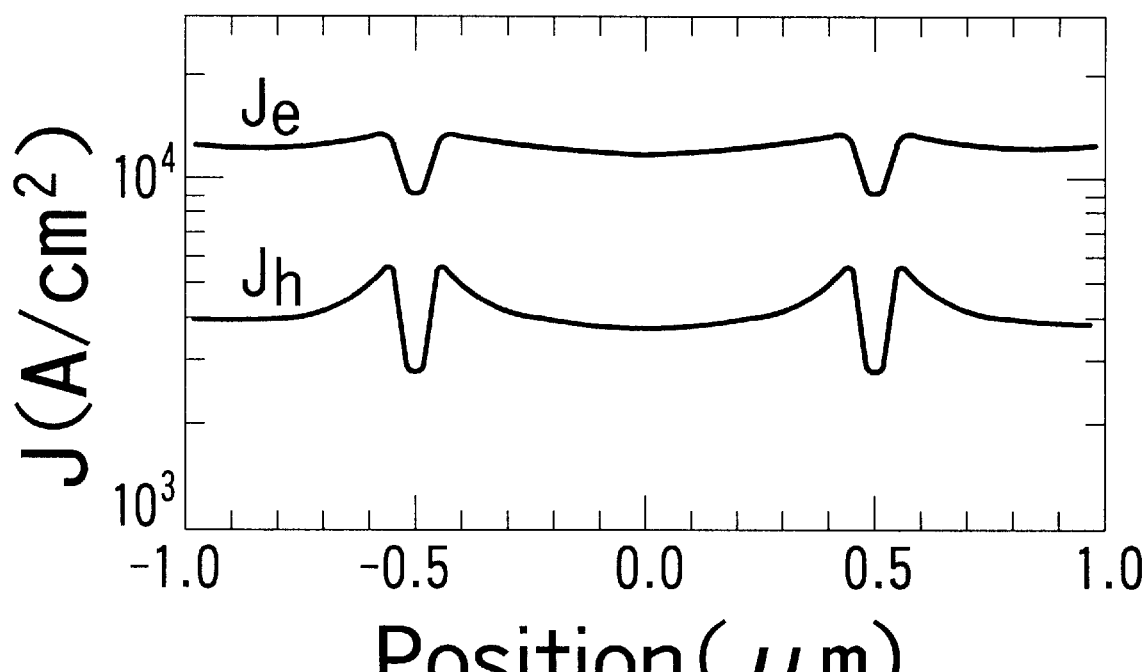
FIG. 16 is a diagram showing current density distribution immediately under hole regions when the voltage of 4V is applied in the two-dimensional simulation shown in FIG. 15.

FIG. 16 shows a current density distribution immediately under the pit regions when a voltage of 4 V is applied to the structure. The current density decreases at the pit regions as much as 30%. As shown, it has been confirmed that the presence of pit regions causes a difference in current density. Then, when laser oscillation occurs due to such a current distribution, oscillation begins in portions with a higher current density, and portions with a lower current density behave as a saturable absorber. Similar results were obtained also when using an adjacent layer doped by $5 \times 10^{17} cm^{-3}$ in lieu of the non-doped adjacent layer. As explained, the presence of pit regions causes a local difference in current density, and portions with a lower current act as a saturable absorber and realizes self-pulsation.

Next explained is the sixth embodiment of the invention.

Figure 17:
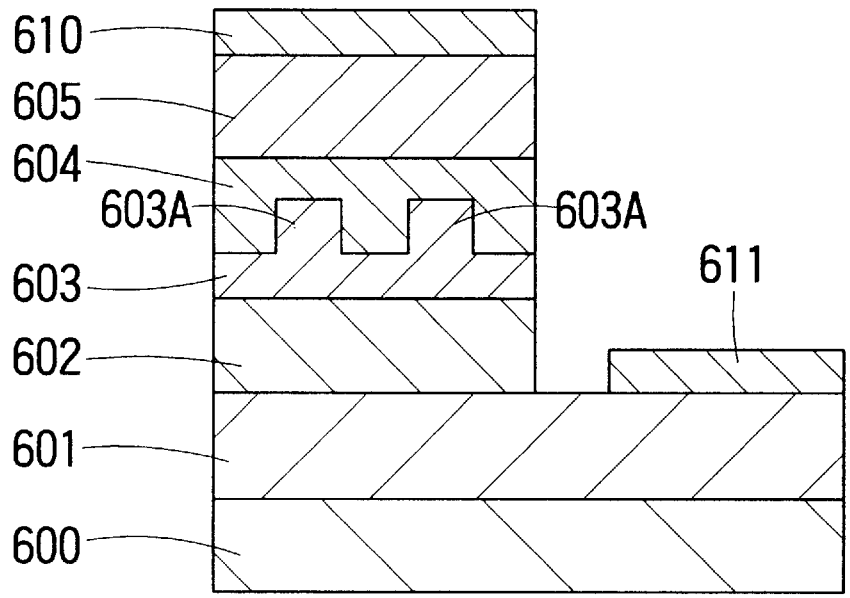
FIG. 17 is a cross-sectional view of a nitride semiconductor light emitting devil taken as the sixth embodiment of the invention.

FIG. 17 illustrates a general construction of a nitride semiconductor light emitting diode according to the sixth embodiment. In the light emitting diode, sequentially stacked on a sapphire substrate 600 are a buffer layer 601, n-type GaN cladding layer 602 (Si-doped, $3 \sim 5 \times 10^{18} cm^{-3}$, 4 $\mu$m), non-doped InGaN active layer 603 (0.2 $\mu$m), p-type GaN cladding layer 604 (Mg-doped, $5 \times 10^{18} cm^{-3}$, 0.3 $\mu$m), and p-type GaN contact layer 605 (Mg-doped, $5 \times 10^{18} cm^{-3}$, 0.5 $\mu$m). Numeral 610 denotes a p-side electrode, and 611 is an n-side electrode.

In the nitride semiconductor light emitting diode according to the sixth embodiment, the non-doped InGaN active layer 603 has formed pit regions along the interface with the p-type GaN cladding layer 604. Due to these pits, convex and concave portions are produced. Convex portions are InGaN layers surrounded by GaN. Excitons locally exist in the regions 603A surrounded by a material having a larger band gap, and result in increasing the emission efficiency. That is, by using the present invention in this manner, a light emitting diode with a high emission efficiency can be obtained.

Next explained is the seventh embodiment of the invention.

Figure 18:
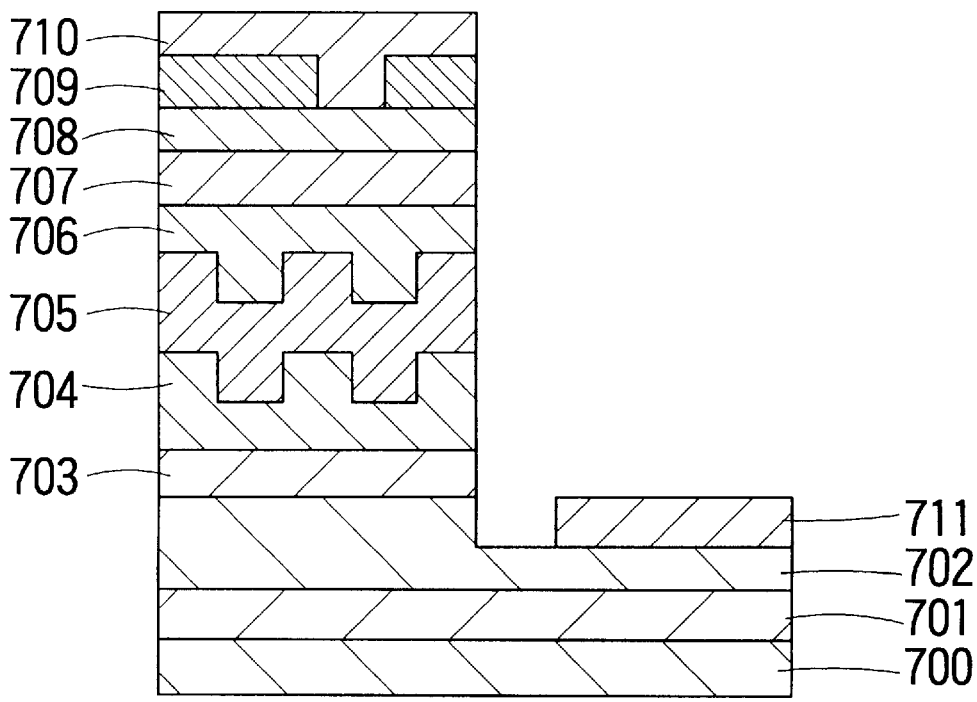
FIG. 18 is a cross-sectional view of a nitride semiconductor light emitting device taken as the seventh embodiment of the invention.

FIG. 18 is a cross-sectional view illustrating a general construction of a nitride semiconductor light emitting device according to the seventh embodiment. In FIG. 18, numeral 700 denotes a sapphire substrate, 701 is a buffer layer, 702 is an n-type GaN contact layer (Si-doped, $3 \sim 5 \times 10^{18} cm^{-3}$, 4 $\mu$m), 703 is an n-type GaN cladding layer (Si-doped, $5 \times 10^{17} cm^{-3}$, 0.3 $\mu$m), 704 is an n-type $In_{0.1}Ga_{0.9}N/In_{0.02}Ga_{0.98}N$ multi-quantum well adjacent layer (Si-doped, $5 \times 10^{17} cm^{-3}$, well width of 2 nm, barrier width of 4 nm, 20 layers), 705 is an $In_{0.2}Ga_{0.8}N/In_{0.05}Ga_{0.95}N$ multi-quantum well active layer (non-doped, well width of 2 nm, barrier width of 4 nm, 10 layers), 707 is a p-type AlGaN cladding layer (Mg-doped, $5 \times 10^{17} cm^{-3}$, 0.1 $\mu$m), 708 is a p-type GaN contact layer (Mg-doped, $5 \times 10^{18} cm^{-3}$, 0.5 $\mu$m), 709 is a $SiO_2$ film, 710 is a p-side electrode, and 711 is an n-side electrode.

The n-type $In_{0.1}Ga_{0.9}N/In_{0.02}Ga_{0.98}N$ multi-quantum well adjacent layer 704 is grown in the following process. Setting the growth temperature to 760° C. and using TMI, TMG, ammonium and $SiH_4$, a 2 nm thick $In_{0.1}Ga_{0.9}N$ well layer is grown. After a break of one second while continuing the supply of ammonium alone, a 4 nm thick $In_{0.02}Ga_{0.98}N$ barrier layer is grown by using TMI, TMG, Ammonium and $SiH_4$. After a interruption of one second, once again, another well layer is grown. Repeating this process 20 times in total, the n-type $In_{0.1}Ga_{0.9}N/In_{0.02}Ga_{0.98}N$ multi-quantum well adjacent layer 704 is obtained.

The $In_{0.2}Ga_{0.8}N/In_{0.05}Ga_{0.95}N$ multi-quantum well active layer 705 is fabricated in the following process. At the growth temperature of 760° C., $In_{0.2}Ga_{0.8}N$ is grown up to the thickness of 2 nm, and, after a break of one second, $In_{0.05}Ga_{0.95}N$ is grown. This sequence is repeated 10 times.

As a result, a structure including the multi-quantum well adjacent layer 704 and the multi-quantum well active layer 705 and having a structure containing island regions and pits can be obtained.

Although the invention has been explained by way of specific embodiments, the invention is not limited to these examples.

For example, the first to seventh embodiments have been explained as using the non-doped active layer, it may be doped into either an n-type or p-type. In this case, the layer adjacent to it may be either non-doped or doped into an n-type or p-type.

In these and other respects, the invention can be modified or changed without departing from the scope and of the invention.

What is claimed is:

1. A nitride compound semiconductor light emitting device comprising:
   a substrate;
   an active layer formed on said substrate and made of a nitride compound semiconductor having a hexagonal crystalline structure; and
   an adjacent layer stacked in contact with said active layer at least either on or under said active layer, and including a nitride compound semiconductor layer having a hexagonal crystalline structure and doped with an impurity,
   said nitride compound semiconductor layer in said adjacent layer including island regions which form a scattered in-plane distribution within said nitride compound semiconductor layer and contain one of elements forming said nitride compound semiconductor thereof with a higher concentration than the surrounding region, said island regions containing said impurity with a lower concentration than said surrounding region.

2. The nitride compound semiconductor light emitting device according to claim 1 wherein each said island region has a portion where the concentration of said one of elements forming the nitride compound semiconductor changes by at least 10% per 2 nm in a direction normal to the C axis of the hexagonal crystal.

3. The nitride compound semiconductor light emitting device according to claim 1 wherein the mean diameter of said island regions is not larger than 100 nm.

4. The nitride compound semiconductor light emitting device according to claim 1 wherein said active layer includes pit regions in a scattered in-plane distribution within said active layer, said pit regions being filled with the nitride compound semiconductor forming said adjacent layer.

5. The nitride compound semiconductor light emitting device according to claim 1 wherein said adjacent layer includes pit regions in a scattered in-plane distribution within said adjacent layer.

6. The nitride compound semiconductor light emitting device according to claim 1 wherein said adjacent layer has multi-quantum wells, and said one of elements forming the nitride compound semiconductor is one of indium, aluminum and gallium.

7. The nitride compound semiconductor light emitting device according to claim 1 wherein said impurity is at least one selected from the group consisting of Si, C, Ge, Sn and Pb.

8. The nitride compound semiconductor light emitting device according to claim 1 wherein said active layer has multi-quantum wells and includes island regions in a scattered in-plane distribution within said active layer, which contain one of elements forming the nitride compound semiconductor with a higher concentration than the surrounding region, said island regions having a band gap equal to or smaller than the band gap of the material of the surrounding region by a difference within 10 meV.

9. The nitride compound semiconductor light emitting device according to claim 8 wherein the relation of $\lambda m = 2nd$ (m=1, 2, 3, 4) is satisfied, where d is the distance between the island regions, n is the refractive index of the surrounding region around the island regions, and $\lambda$ is the emission wavelength of said island regions.

10. The nitride compound semiconductor light emitting device according to claim 8 wherein said active layer has pit regions in a scattered in-plane distribution within said active layer, said pit regions being filled with the semiconductor forming said adjacent layer, and wherein said adjacent layer has pit regions in a scattered in-plane distribution within the layer, said pit regions being filled with a semiconductor forming a layer adjacent thereto other than said active layer.

11. The nitride compound semiconductor light emitting device according to claim 8 wherein the mean diameter of said island regions is not larger than 100 nm.

12. A nitride compound semiconductor light emitting device comprising:
    a substrate;
    an active layer formed on said substrate and made of a nitride compound semiconductor containing at least three different elements as matrix components thereof and having a hexagonal crystalline structure; and
    an adjacent layer stacked in contact with said active layer at least either on or under said active layer, and including a nitride compound semiconductor layer having a hexagonal crystalline structure and doped with an impurity,
    said active layer including pit regions which form a scattered in-plane distribution within said layer and are filled with the semiconductor forming said adjacent layer.

13. The nitride compound semiconductor light emitting device according to claim 12 wherein said adjacent layer has formed pit regions in a scattered in-plane distribution within said adjacent layer.

14. The nitride compound semiconductor light emitting device according to claim 12 wherein said active layer has multi-quantum wells and includes island regions in a scattered in-plane distribution within said layer, which contain one of elements forming the nitride compound semiconductor with a higher concentration than the surrounding region, said island regions having a band gap equal to or smaller than the band gap of the material of the surrounding region by a difference within 10 meV.

15. The nitride compound semiconductor light emitting device according to claim 14 wherein the mean diameter of said island regions in said active layer is not larger than 100 nm.

16. The nitride compound semiconductor light emitting device according to claim 12 wherein said active layer has a multi-quantum well structure which includes at least an InGaN layer.

17. A nitride compound semiconductor light emitting device comprising:

a substrate;

an active layer formed on said substrate and made of a nitride compound semiconductor having a hexagonal crystalline structure; and an adjacent layer stacked in contact with said active layer at least either on or under said active layer, and including a nitride compound semiconductor layer having a hexagonal crystalline structure and doped with an impurity, said adjacent layer having pit regions in a scattered in-plane distribution within said adjacent layer.

* * * * *